United States Patent
Peng et al.

(10) Patent No.: US 7,023,189 B2
(45) Date of Patent: Apr. 4, 2006

(54) VOLTAGE REGULATOR CIRCUIT OF INTEGRATED CIRCUIT CHIP

(75) Inventors: Hsi-Chih Peng, Taipei (TW); Lulu Chuang, Taipei (TW)

(73) Assignee: Vi Networking Technologies, Inc., Taipei (TW)

( * ) Notice: Subject to any disclaimer, the term of this patent is extended or adjusted under 35 U.S.C. 154(b) by 0 days.

(21) Appl. No.: 10/876,182

(22) Filed: Jun. 24, 2004

(65) Prior Publication Data
US 2005/0024029 A1    Feb. 3, 2005

(30) Foreign Application Priority Data
Aug. 1, 2003    (TW) ............................... 92214097 U

(51) Int. Cl.
*G05F 1/56*    (2006.01)
*G05F 1/618*    (2006.01)
(52) U.S. Cl. ..................... 323/274; 323/284; 323/275
(58) Field of Classification Search ............... 323/274, 323/275, 273, 284, 283
See application file for complete search history.

(56) References Cited

U.S. PATENT DOCUMENTS

| 5,578,960 A | * | 11/1996 | Matsumura et al. | ......... 327/535 |
| 6,667,604 B1 | * | 12/2003 | Yanagisawa | ................ 323/274 |
| 6,822,428 B1 | * | 11/2004 | Miyanaga et al. | ........... 323/284 |
| 6,897,638 B1 | * | 5/2005 | Miyanaga et al. | ........... 323/274 |

\* cited by examiner

*Primary Examiner*—Bao Q. Vu
(74) *Attorney, Agent, or Firm*—Madson & Austin

(57) ABSTRACT

A voltage regulator circuit for use with an integrated circuit (IC) chip and an external voltage source includes a first transistor and a second transistor. The first transistor has the emitter thereof electrically connected to the external voltage source and the collector thereof electrically connected to the IC chip via a power input pin. The second transistor has the collector thereof electrically connected to ground, the base thereof electrically connected to the IC chip via a voltage-regulation control pin, and the emitter electrically connected to the base of the first transistor. The voltage regulator circuit is utilized for regulating a source voltage received from the external voltage source via the first transistor in response to a current signal flowing through the voltage-regulation control pin to have the regulated voltage inputted into the integrated circuit chip via the power input pin.

10 Claims, 3 Drawing Sheets

VOLTAGE REGULATOR CIRCUIT OF INTEGRATED CIRCUIT CHIP

FIELD OF THE INVENTION

The present invention relates to a voltage regulator circuit, and more particularly to a voltage regulator circuit of an integrated circuit chip for regulating voltage from an external voltage source to a level required by the integrated circuit chip.

BACKGROUND OF THE INVENTION

With rapid development in IC design and manufacturing technology, various circuits for performing different functions can be integrated into a single integrated circuit (IC) chip. Since the working voltages for respective circuits may be different, a voltage regulator circuit is employed for regulating the voltage supplied from the external voltage source to required levels. Referring to FIG. 1, a conventional voltage regulator comprises two voltage regulating units 12 and 13 for regulating the constant voltage V0 received from the external voltage source 11 into two voltages V1 and V2 to be respectively provided for two different circuits (not shown) of the IC chip 10. In each of the voltage regulating units 12 and 13, the emitter of the bipolar junction transistor 120 (130) is connected to the external voltage source 11, and the base and collector of the bipolar junction transistor 120 (130) are electrically connected to the IC chip 10 via a control pin 100 (102) and a power input pin 101 (103), respectively. The operation principle of the voltage regulator circuit will be illustrated hereinafter by taking the voltage regulating unit 12 as an example.

The constant voltage V0 provided by the external voltage source 11 is transmitted to the emitter of the bipolar junction transistor 120 to be regulated according to the current intensity flowing through the control pin 100. The current intensity is controlled by the power control means of the IC chip 10. Then, a regulated voltage V1 is outputted from the collector of the bipolar junction transistor 120 and provided for a first circuit portion of the IC chip 10 via the buffer capacitor 121 and the power input pin 101. Likewise, a regulated voltage V2 can be provided for a second circuit portion of the IC chip 10 via the buffer capacitor 131 and the power input pin 103 after the regulated operation of the constant voltage V0 by the bipolar junction transistor 130.

The above voltage regulator circuit is advantageous to effectively provide required working voltages for the IC chip. However, there are still some shortcomings occurring in the conventional voltage regulator circuit. For example, when the voltage V0 supplied from the external voltage source 11 is about 3~5 volts and the voltage V1 or V2 required by the IC chip 10 is about 1~3 volts, the current intensity flowing through the control pin 100 or 102 would be in the order of tens to hundreds of milliamperes (mA). For dealing with this order of current intensity, the control pin 100 or 102 has to occupy a number of pads, and thus large area of the IC chip is wastefully occupied. In addition, once the collector of either of the bipolar junction transistors 120 or 130 is undesirably short-circuited, a large amount of current will flow through the bipolar junction transistor and may burn down the bipolar junction transistor.

SUMMARY OF THE INVENTION

The present invention provides a voltage regulator circuit involving a reduced pad number while achieving the similar voltage-regulation purpose so as to make use of the area of the IC chip.

The present invention further provides a voltage regulator circuit with a protection mechanism capable of preventing large current intensity from flowing therethrough.

In accordance with a first aspect of the present invention, there is provided a voltage regulator circuit for use with an integrated circuit (IC) chip and an external voltage source. The voltage regulator circuit comprises a first transistor and a second transistor. The first transistor has the emitter thereof electrically connected to the external voltage source and the collector thereof electrically connected to the IC chip via a power input pin. The second transistor has the collector thereof electrically connected to ground, the base thereof electrically connected to the IC chip via a voltage-regulation control pin, and the emitter electrically connected to the base of the first transistor. The voltage regulator circuit is utilized for regulating a source voltage received from the external voltage source via the first transistor in response to a current signal flowing through the voltage-regulation control pin to have the regulated voltage inputted into the integrated circuit chip via the power input pin.

In an embodiment, the voltage regulator circuit further comprises a current-limiting resistor electrically connected between the base of the first transistor and the emitter of the second transistor.

Preferably, each of the first and the second transistors is a bipolar junction transistor.

In an embodiment, the voltage regulator circuit further comprises a buffer capacitor electrically connected between the power input pin and the ground for stabilizing the regulated voltage provided for the integrated circuit chip via the power input pin.

In accordance with a second aspect of the present invention, there is provided a voltage regulator circuit for use with an integrated circuit (IC) chip and an external voltage source. The voltage regulator circuit comprises a first transistor and a second transistor. The first transistor has the source electrode thereof electrically connected to the external voltage source and the drain electrode thereof electrically connected to the IC chip via a power input pin. The second transistor has the drain electrode thereof electrically connected to ground, the gate electrode thereof electrically connected to the IC chip via a voltage-regulating control pin, and the source electrode electrically connected to the gate electrode of the first transistor. The voltage regulator circuit is utilized for regulating a source voltage received from the external voltage source via the first transistor in response to a voltage signal at the voltage-regulation control pin to have the regulated voltage inputted into the integrated circuit chip via the power input pin.

In an embodiment, the voltage regulator circuit further comprises a current-limiting resistor electrically connected between the external voltage source and the source electrode of the second transistor.

Preferably, each of the first and the second transistors is a metal-oxide-semiconductor-field-effect transistor.

The above contents and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
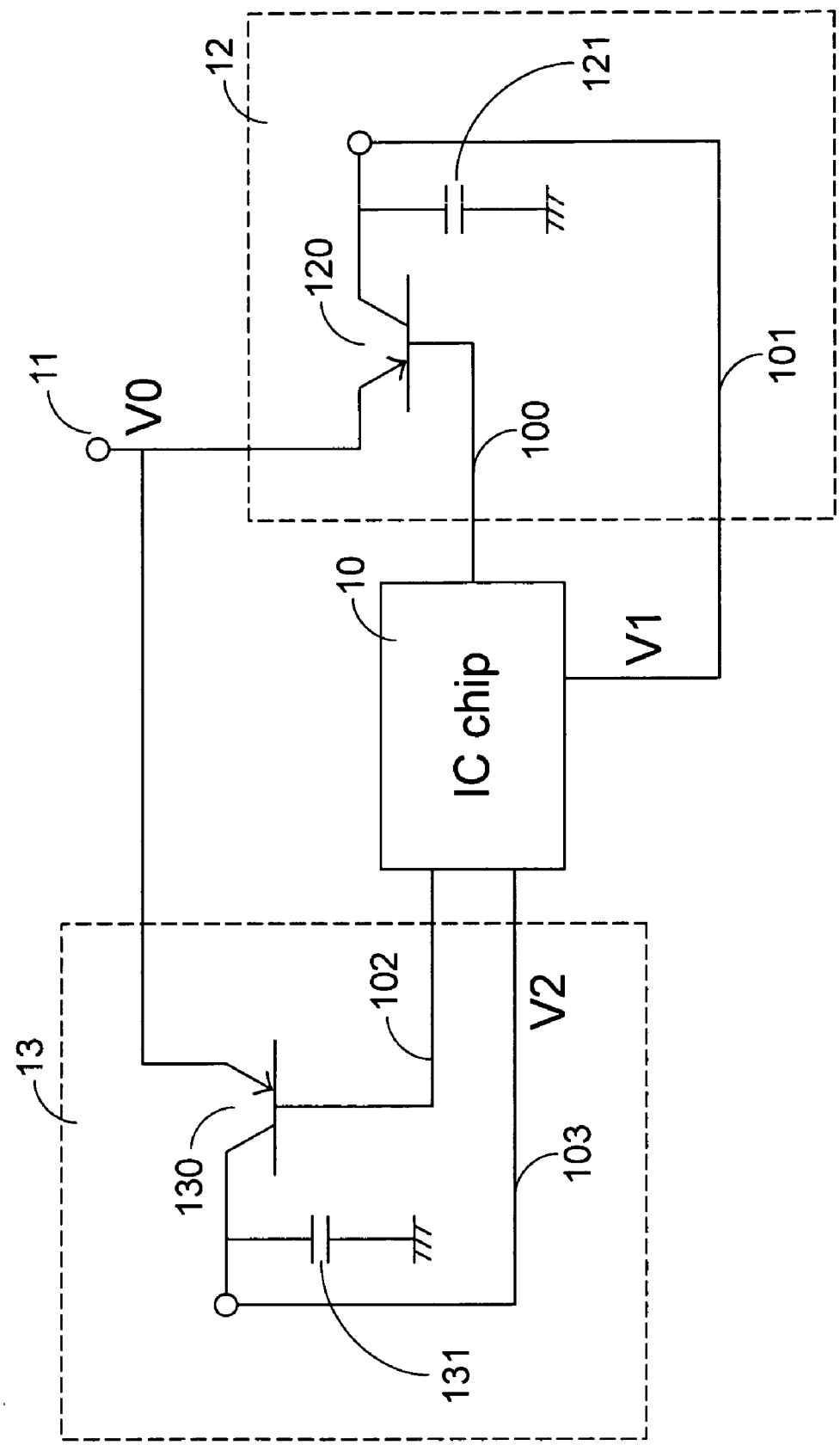
FIG. 1 is a schematic circuit block diagram illustrating a conventional voltage regulator circuit of an IC chip.
Figure 2:
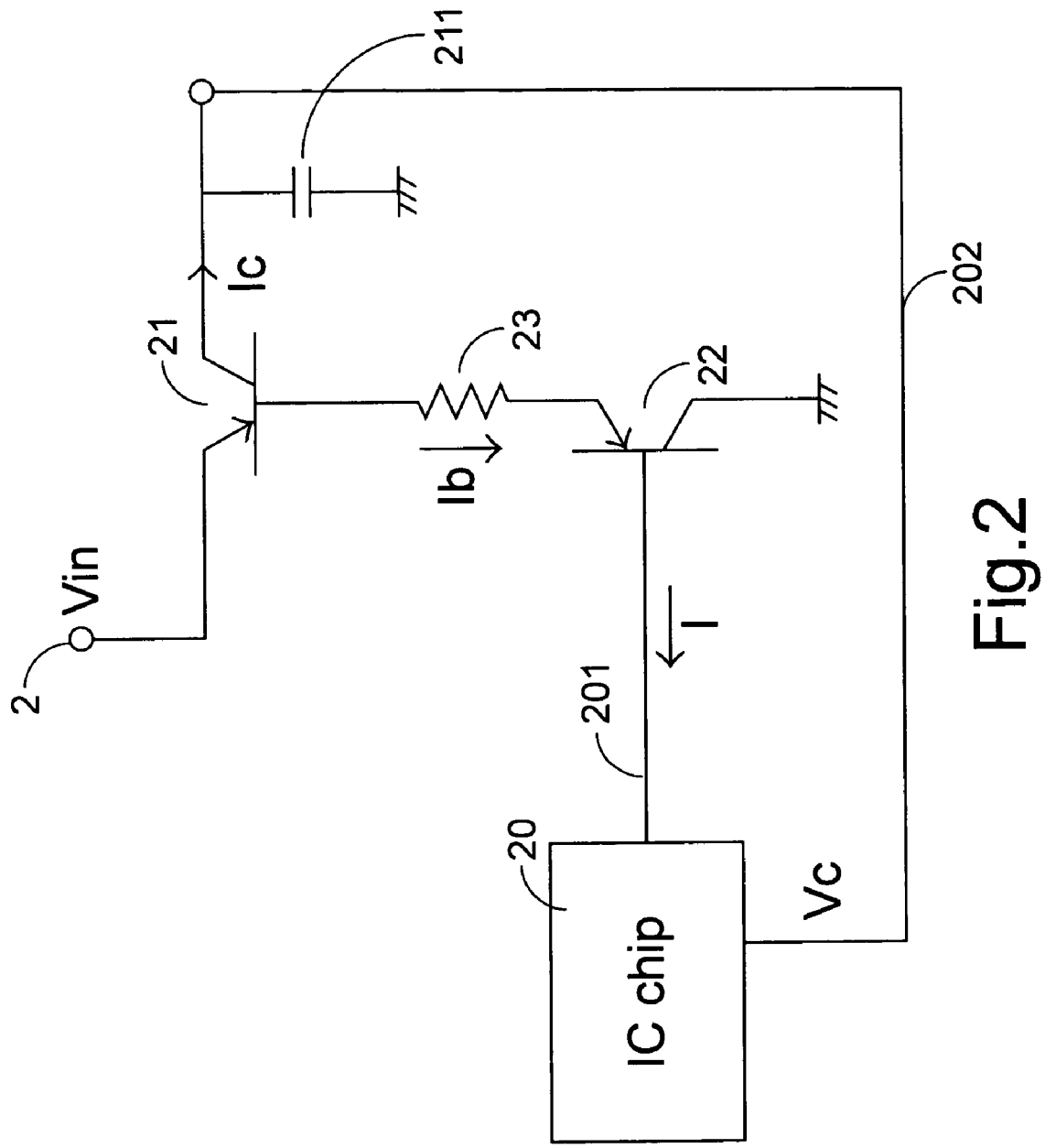
FIG. 2 is a schematic circuit block diagram illustrating a voltage regulator circuit of an IC chip according to an embodiment of the present invention.

Referring to FIG. 2, a voltage regulator circuit according to a preferred embodiment of the present invention comprises a first bipolar junction transistor 21 and a second bipolar junction transistor 22 for regulating the constant voltage Vin received from the external voltage source 2 into a voltage adapted to the IC chip 20. The emitter of the first bipolar junction transistor 21 is coupled to the external voltage source 2, and the collector is electrically connected to the IC chip 20 via a buffer capacitor 211 and a power input pin 202. Herein, one side of the buffer capacitor 211 is connected to the collector of the first bipolar junction transistor 21 and another side of the buffer capacitor 211 is connected to ground. The collector and the emitter of the second bipolar junction transistor 22 are coupled to ground and the base of the first bipolar junction transistor 21, respectively. The base of the second bipolar junction transistor 22 is electrically connected to the IC chip 20 via a voltage-regulation control pin 201. Furthermore, an optional current-limiting resistor 23 is located between the base of the first bipolar junction transistor 21 and the emitter of the second bipolar junction transistor 22.

The constant voltage Vin supplied by the external voltage source 2 and received by the emitter of the first bipolar junction transistor 21 is regulated according to the current intensity flowing through the voltage-regulation control pin 201, which is controlled by power control means of the IC chip 20. Then, a regulated voltage Vc can be provided for the IC chip 20 through the power input pin 202. Further, for stabilizing the regulated voltage Vc, the optional buffer capacitor 211 disposed between the bipolar junction transistor 21 and the IC chip 20 could be used to form a buffer.

Assuming that the gains of current for the first bipolar junction transistor 21 and the second bipolar junction transistor 22 are $\beta 1$ and $\beta 2$, respectively, the current Ib at the base of the second bipolar junction transistor 22 will equal to $Ic/\beta 1$, where Ic is the current at the collector of the first bipolar junction transistor 21. On the other hand, the current at the base of the second bipolar junction transistor 22 is computed as $I=Ib/(1+\beta 2)=Ic/(\beta 1\times(1+\beta 2))$, which is much less than the collector current Ic. For example, when the voltage Vin supplied from the external voltage source 2 is about 3~5 volts, the current intensity flowing through the control pin 201 would be in the order of tens of microamperes (µA). Since the current intensity flowing through the control pin 201 is largely reduced, the required number of pads can be minimized and thus the area of the IC chip can be saved.

To prevent any problem happen when the collector of the first bipolar junction transistor 21 is short-circuited, the optional current-limiting resistor 23 could be used to have the current flowing into the emitter of second bipolar junction transistor 22 via the current-limiting resistor 23 become $Ib=(Vin-V_{q1be}-V_{q2ce})/R$, where $V_{q1be}$ is voltage difference between the emitter and the base of the first bipolar junction transistor 21, $V_{q2ce}$ is voltage difference between the emitter and the collector of the second bipolar junction transistor 22, and R is the resistance of the current-limiting resistor 23. In other words, the current-limiting resistor 23 may reduce amount of current flowing through the first bipolar junction transistor 21 so as to prevent from burning down the first bipolar junction transistor 21.

Figure 3:
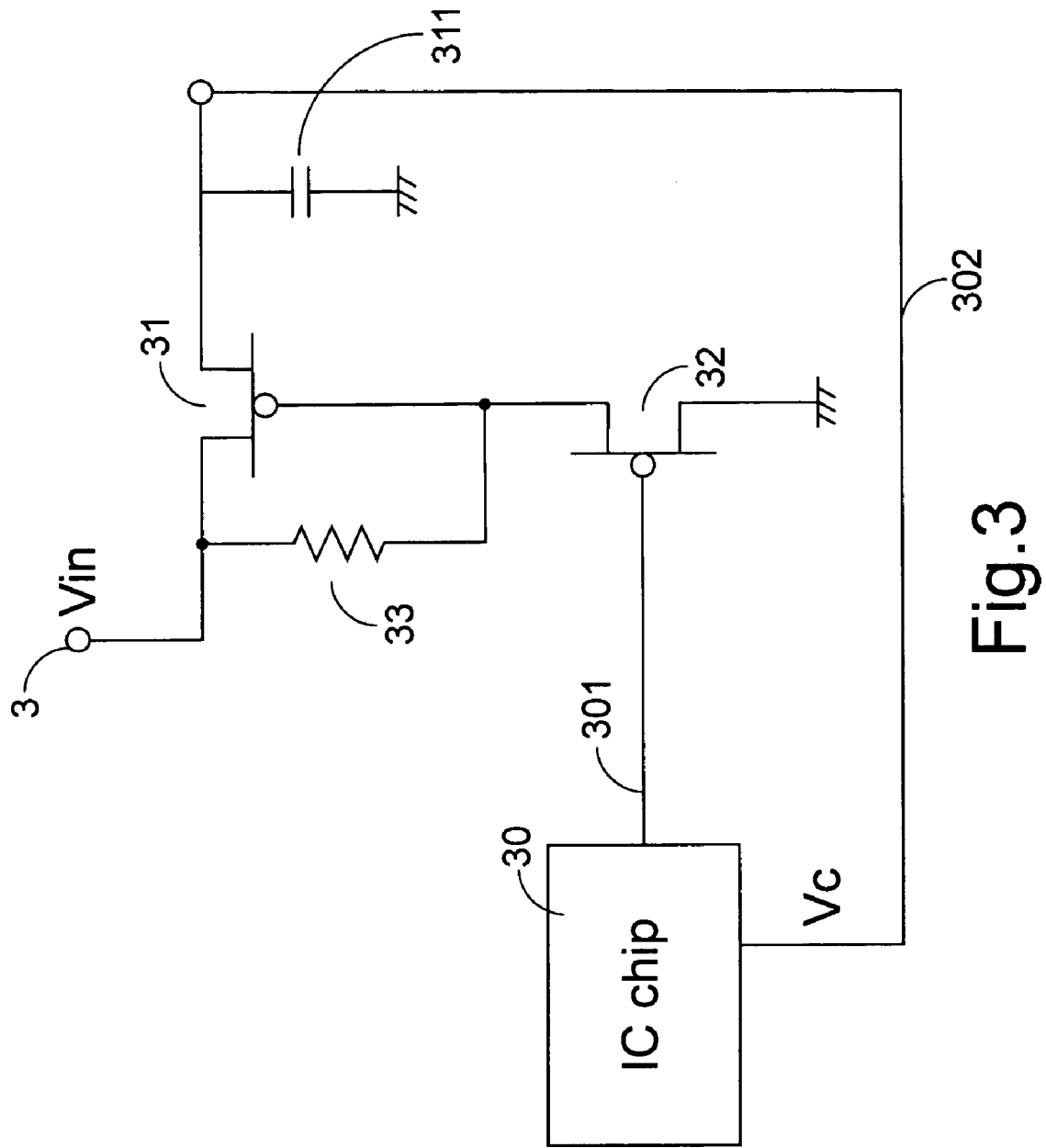
FIG. 3 is a schematic circuit block diagram illustrating a voltage regulator circuit of an IC chip according to another embodiment of the present invention.

A further embodiment of a voltage regulator circuit for use with an IC chip according to the present invention is illustrated in FIG. 3. In this embodiment, the voltage regulator circuit comprises a first metal-oxide-semiconductor-field-effect transistor (MOSFET) 31 and a second MOSFET 32 for regulating the constant voltage Vin received from the external voltage source 3 into a voltage Vc to be provided for the IC chip 30. The source electrode of the first MOSFET 31 is connected to the external voltage source 3, and the drain electrode of the first MOSFET 31 is electrically connected to the IC chip 30 via a power input pin 302. The drain electrode of the second MOSFET 32 is connected to ground, and the source electrode of the second MOSFET 32 is connected to the gate electrode of the first MOSFET 31. The gate electrode of the second MOSFET 32 is electrically connected to the IC chip 30 via voltage-regulation control pin 301.

The constant voltage Vin supplied by the external voltage source 3 and received by the source electrode of the first MOSFET 31 is regulated according to the voltage outputted by the IC chip 30 through the voltage-regulation control pin 301. Then, a regulated voltage Vc can be provided for the IC chip 30 through the power input pin 302. Further, for stabilizing the regulated voltage Vc, an optional buffer capacitor 311 could be disposed between the first MOSFET 31 and the IC chip 30.

In this embodiment, an optional current-limiting resistor 33 could be interconnected between the external voltage source 3 and the gate electrode of the first MOSFET 31. In other words, the optional current-limiting resistor 33 is directly coupled to the external voltage source 3 rather than electrically connected in series between the first MOSFET 31 and the second MOSFET 32 because these MOSFETs are voltage-controlled and the currents flowing therethrough are relatively small. Due to relatively small current flowing through these MOSFETs, the number of pads on the IC chip 30 can be minimized and thus the area of the IC chip can be reduced. The current-limiting resistor 33 may further reduce the current flowing through the first MOSFET 31 so as to prevent from burning down the first MOSFET 31. It is to be noted, however, that the resulting current should be intense enough for the normal operation of the transistor 32.

According to the present invention, the arrangement of the second transistor between the first transistor and the IC chip facilitates the control of the voltage received by the power input pin. In addition, by providing the current-limiting resistor, the current intensity flowing through the voltage regulator circuit can be well confined so as to prevent from burning down or short circuit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage regulator circuit for use with an integrated circuit (IC) chip and an external voltage source, comprising:
   a first transistor having the emitter thereof electrically connected to said external voltage source and the collector thereof electrically connected to said IC chip via a power input pin; and
   a second transistor having the collector thereof electrically connected to ground, the base thereof electrically connected to said IC chip via a voltage-regulation control pin, and the emitter electrically connected to the base of said first transistor, for regulating a source voltage received from said external voltage source via said first transistor in response to a current signal flowing through said voltage-regulation control pin to have the regulated voltage inputted into said integrated circuit chip via said power input pin.

2. The voltage regulator circuit according to claim 1 further comprising a current-limiting resistor electrically connected between the base of said first transistor and the emitter of said second transistor.

3. The voltage regulator circuit according to claim 1 wherein each of said first and said second transistors is a bipolar junction transistor.

4. The voltage regulator circuit according to claim 1 further comprising a buffer capacitor electrically connected between said power input pin and said first transistor for stabilizing the regulated voltage provided for said integrated circuit chip via said power input pin.

5. The voltage regulator circuit according to claim 4 wherein one side of the buffer capacitor is connected to the ground and another side of the buffer capacitor is connected to the collector of said first transistor.

6. A voltage regulator circuit for use with an integrated circuit (IC) chip and an external voltage source, comprising:
   a first transistor having the source electrode thereof electrically connected to said external voltage source and the drain electrode thereof electrically connected to said IC chip via a power input pin; and
   a second transistor having the drain electrode thereof electrically connected to ground, the gate electrode thereof electrically connected to said IC chip via a voltage-regulating control pin, and the source electrode electrically connected to the gate electrode of said first transistor, for regulating a source voltage received from said external voltage source via said first transistor in response to a voltage signal at said voltage-regulation control pin to have the regulated voltage inputted into said integrated circuit chip via said power input pin.

7. The voltage regulator circuit according to claim 6 further comprising a current-limiting resistor electrically connected between said external voltage source and the source electrode of said second transistor.

8. The voltage regulator circuit according to claim 6 wherein each of said first and said second transistors is a metal-oxide-semiconductor-field-effect transistor.

9. The voltage regulator circuit according to claim 6 further comprising a buffer capacitor electrically connected between said power input pin and said first transistor for stabilizing the regulated voltage provided for said integrated circuit chip via said power input pin.

10. The voltage regulator circuit according to claim 8 wherein one side of the buffer capacitor is connected to the ground and another side of the buffer capacitor is connected to the collector of said first transistor.

* * * * *